United States Patent
Böhm et al.

(10) Patent No.: US 10,971,919 B2
(45) Date of Patent: Apr. 6, 2021

(54) ELECTRONIC CIRCUIT-BREAKER FOR A LOAD THAT CAN BE CONNECTED TO A LOW VOLTAGE DC-VOLTAGE NETWORK

(71) Applicant: DEHN + SÖHNE GMBH + CO. KG, Neumarkt/Opf. (DE)

(72) Inventors: Thomas Böhm, Hohenfels (DE); Franz Schork, Nuremberg (DE)

(73) Assignee: DEHN SE + CO KG, Neumarkt/Opf. (DE)

( * ) Notice: Subject to any disclaimer, the term of this patent is extended or adjusted under 35 U.S.C. 154(b) by 100 days.

(21) Appl. No.: 16/481,555

(22) PCT Filed: Feb. 1, 2018

(86) PCT No.: PCT/EP2018/052456
§ 371 (c)(1),
(2) Date: Jul. 29, 2019

(87) PCT Pub. No.: WO2018/149649
PCT Pub. Date: Aug. 23, 2018

(65) Prior Publication Data
US 2019/0372333 A1    Dec. 5, 2019

(30) Foreign Application Priority Data

Feb. 16, 2017  (DE) ..................... 10 2017 103 221.5
May 2, 2017    (DE) ..................... 10 2017 109 378.8

(51) Int. Cl.
*H03K 17/082* (2006.01)
*H02H 9/02* (2006.01)
(Continued)

(52) U.S. Cl.
CPC ............ *H02H 3/38* (2013.01); *H02H 1/0007* (2013.01); *H02H 9/02* (2013.01); *H02H 9/04* (2013.01); *H03K 17/082* (2013.01)

(58) Field of Classification Search
CPC ........... H02H 9/02; H02H 9/04; H03K 17/082
(Continued)

(56) References Cited

U.S. PATENT DOCUMENTS

| 5,440,441 A | 8/1995 | Ahuja ............................. 361/62 |
| 5,875,087 A | 2/1999 | Spencer et al. ................. 361/87 |

(Continued)

FOREIGN PATENT DOCUMENTS

| DE | 10358694 A1 | 7/2005 | ............. H02H 11/00 |
| DE | 102004036164 A1 | 3/2006 | ............... H02H 3/20 |

(Continued)

OTHER PUBLICATIONS

An Office Action (in German), dated Jan. 15, 2018, issued by the German Patent Office for Applicant's corresponding German Patent Application No. DE102017109378.8, filed May 2, 2017.

(Continued)

*Primary Examiner* — Gary A Nash
(74) *Attorney, Agent, or Firm* — Bodner & O'Rourke, LLP; Gerald T. Bodner; Christian P. Bodner

(57) ABSTRACT

The invention relates to an electronic circuit-breaker for a load (RL) that can be connected to a low-voltage dc-voltage network, the circuit-breaker consisting of assemblies provided between input terminals and the load and said assemblies comprising a voltage monitoring unit (TVS1, R1), a current monitoring unit (Shunt, OPV), semiconductor switch units (MOSFET) and controllers (uC) associated therewith. According to the invention, a series circuit consisting of a TVS diode (TVS1) and a resistor (R1) is connected to the input terminals, the resistor having a connection to a first connector (1) of a microcontroller (uC) and the resultant voltage drop at the resistor providing the microcontroller with an overvoltage identification signal if a breakdown voltage is reached at the TVS diode as a result (Continued)

Figure 1:
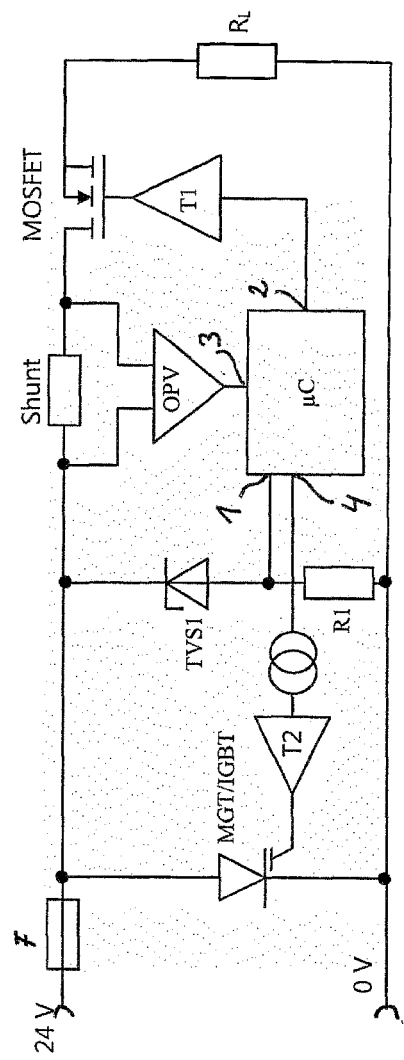

of an overvoltage. A second connector (2) of the microcontroller has a connection to a first semiconductor switch unit (MOSFET), the first semiconductor switch unit being in series, as an elongate switch, with the load (RL), and the microcontroller disabling the switch in the event of an overvoltage detection signal. A shunt acting as a current monitoring unit is in series with the load, the voltage drop at the shunt being analysed by the microcontroller via a third connector (3) and if an overcurrent which exceeds a threshold value is identified, the load is switched off by means of the first semiconductor switch unit. In addition, a MOS-gated thyristor (MGT) is connected between the input terminals, the control input of said thyristor having a connection to a fourth connector (4) of the microcontroller, such that the MOS-gated thyristor can be activated in the event of an overvoltage identification signal.

11 Claims, 2 Drawing Sheets

(51) Int. Cl.
*H02H 9/04* (2006.01)
*H02H 3/38* (2006.01)
*H02H 1/00* (2006.01)

(58) Field of Classification Search
USPC .............................. 361/55, 86, 87
See application file for complete search history.

(56) References Cited

U.S. PATENT DOCUMENTS

| | | | |
|---|---|---|---|
| 7,924,538 B2 | 4/2011 | Weinert | 361/56 |
| 8,605,400 B2 | 12/2013 | Wetter et al. | 361/91.1 |
| 8,649,145 B2 | 2/2014 | Frey et al. | 361/111 |
| 9,401,593 B2 | 7/2016 | Gascuel | |
| 2003/0202304 A1* | 10/2003 | Canova | H02H 3/025 |
| | | | 361/93.1 |
| 2006/0120000 A1 | 6/2006 | Fiesoli et al. | 361/93.1 |
| 2015/0061461 A1* | 3/2015 | Schrod | F02D 41/2096 |
| | | | 310/316.03 |
| 2015/0333509 A1* | 11/2015 | Jankowski | H02H 9/041 |
| | | | 361/35 |
| 2016/0149403 A1 | 5/2016 | Ikeda | 361/56 |

FOREIGN PATENT DOCUMENTS

| | | | | |
|---|---|---|---|---|
| DE | 102006003620 A1 | 8/2007 | | H02H 3/38 |
| DE | 102006054354 A1 | 5/2008 | | H02H 7/20 |
| DE | 102007016704 A1 | 10/2008 | | H02H 3/00 |
| DE | 102010006525 A1 | 8/2011 | | H02H 9/00 |
| DE | 102011016140 A1 | 9/2012 | | H02H 3/20 |
| DE | 102015105426 A1 | 10/2016 | | H02H 3/05 |
| DE | 102016001742 A1 | 2/2017 | | H02H 9/04 |
| EP | 0686953 A1 | 12/1995 | | H02H 11/00 |
| EP | 3104483 A1 | 12/2016 | | H01H 83/10 |
| WO | WO2011070235 A1 | 6/2011 | | H02H 3/06 |
| WO | WO2017021013 A1 | 2/2017 | | H01L 27/02 |

OTHER PUBLICATIONS

The Notification Concerning Transmittal of International Preliminary Report on Patentability (Chapter I of the Patent Cooperation Treaty), in English, dated Aug. 29, 2019, which was issued by the International Bureau of WIPO in Applicant's corresponding international PCT application having Serial No. PCT/EP2018/052456, filed on Feb. 1, 2018.

The English translation of the International Preliminary Report on Patentability (Chapter I of the Patent Cooperation Treaty), dated Aug. 20, 2019, which was issued by the International Bureau of WIPO in Applicant's corresponding international PCT application having Serial No. PCT/EP2018/052456, filed on Feb. 1, 2018.

The Written Opinion of the International Searching Authority, in English, dated Aug. 30, 2018, which was issued by the International Bureau of WIPO in Applicant's corresponding international PCT application having Serial No. PCT/EP2018/052456, filed on Feb. 1, 2018.

The International Search Report, in English, dated Aug. 30, 2018, which was issued by the International Bureau of WIPO in Applicant's corresponding international PCT application having Serial No. PCT/EP2018/052456, filed on Feb. 1, 2018.

* cited by examiner

ELECTRONIC CIRCUIT-BREAKER FOR A LOAD THAT CAN BE CONNECTED TO A LOW VOLTAGE DC-VOLTAGE NETWORK

The invention relates to an electronic circuit-breaker for a load that can be connected to a low voltage DC-voltage network, the circuit-breaker consisting of assemblies provided between input terminals and the load, and the assemblies comprising a voltage monitoring unit, a current monitoring unit and semiconductor switch units and controllers associated therewith according to claim 1.

In various embodiments, electronic circuit-breakers are part of the state of the art. Typical operating ranges of these circuit-breakers are in the range up to 200 A in voltage classes between 12 V and 100 V DC-voltage.

For protecting DC-voltage networks and loads connected to DC-voltage networks, overvoltage protection devices on the basis of varistors, gas arresters, spark gaps or the like are moreover known. If overvoltage protection devices of the known type and electronic circuit-breakers are used in a not coordinated manner, uncontrollable problems will occur leading to the circuit-breaker being unintentionally triggered or the overvoltage protection devices responding inadvertently and thus resulting in unallowably long downtimes. In particular for industrial applications, such downtimes must be avoided. It is also crucial to exclude a hitherto usual manual restart of protection devices.

Regarding this, the document U.S. Pat. No. 5,875,087 A shows a protection device with an integrated control for protecting electrical systems, wherein a combination of overvoltage and overcurrent protection for AC networks with automatic resetting is disclosed. According to U.S. Pat. No. 5,875,087 A, a current sensor is used for detecting overcurrents, which supplies a digital control unit with relevant current data. The control unit evaluates this data and drives a mechanical switching device or a thermally activatable switch. The use of mechanical or thermal switching devices, however, leads in turn to unacceptable long reaction times.

From DE 10 2015 105 426 A1, a safety device for a rechargeable electrical energy storage device is already known. Regarding this, rapid suppression or interruption of an electric current flow is intended be enabled when abnormal parameters exist. In this case, the energy consumption is intended to be reduced for the safety device. According to the teaching therein, a plurality of semiconductor switching units for a primary reversible suppression of the current flow are used as a function of monitoring the current flow and/or the voltage. A pyrotechnically triggerable switching unit is present for an irreversible suppression of the current flow. Independently of the technical expenditure and the trigger time of such a pyrotechnically operable switching unit, reconnecting the load to the current supply or the mains is not possible or only at a great effort.

With the hitherto known electronic circuit-breakers it is not possible to protect connected loads from transient overvoltages with pulse shapes of 8/20 μs or 10/350 μs, and at the same time from occurring short-circuit currents. Regarding this, reaction times in the nanosecond range would be necessary. Likewise, there must be the possibility to realize low response voltages.

From the aforementioned, it is therefore a task of the invention to propose a further developed electronic circuit-breaker for a load that can be connected to a low voltage DC-voltage network, which electronic circuit-breaker completely dispenses with mechanical switching elements or switching devices and is capable of guaranteeing reaction time in the nanosecond range. In doing so, the electronic circuit-breaker to be created should guarantee protection from overvoltages but also from overcurrents in a combined way. When an overvoltage event ends, the electronic circuit-breaker is intended to automatically change over into the normal operating state without requiring manual intervention.

The task of the invention is solved by means of an electronic circuit-breaker according to the feature combination of claim 1, the dependent claims including at least appropriate configurations and further developments.

With the circuit-breaker according to the invention, evaluation of the respective events is performed by an integrated logic using a microcontroller. Thus, load short-circuits may be evaluated separately from overvoltage events. If triggering of the circuit-breaker is induced due to an overvoltage event, the circuit-breaker can be reset by the microcontroller after the overvoltage so that the result will not be a failure of the system to be protected or of the load, respectively.

With the solution according to the invention, it is thus no longer necessary for overvoltage protection and overcurrent protection to be realized by two switching units or devices. An external system judgement after triggering of the circuit-breaker is no longer necessary. It is likewise not necessary to activate a circuit-breaker that has responded again externally.

The combination according to the invention moreover succeeds in guaranteeing the required low response voltage in DC-voltage networks of, for example, 24 Volt systems. Regarding these, fast switching MOSFETs or IGBTs are employed.

The solution according to the invention furthermore succeeds in effecting a protection of the load from so-called power crossing, that means a cross talk from a higher voltage potential to the nominal voltage.

The electronic circuit-breaker consists of assemblies arranged between input terminals and the load. These assemblies comprise a voltage monitoring unit, a current monitoring unit and semiconductor switch units and controllers associated therewith.

According to the invention, a series circuit consisting of a TVS diode and a resistor is connected to the input terminals. To the point of connection between the resistor and the TVS diode, a first connector of a microcontroller is connected.

When a breakdown voltage is reached at the TVS diode as a result of an overvoltage, the resultant voltage drop at the resistor R1 provides the first connection of the microcontroller with a signal. This signal serves as an overvoltage identification signal.

A second connector of the microcontroller has a connection to a first semiconductor switch unit.

The first semiconductor switch unit is provided in series, as an elongate switch, to the load, wherein the microcontroller disables the first switch unit when the overvoltage identification signal is applied.

A shunt configured as a current monitoring unit, is furthermore in series to the load.

The voltage drop at the shunt is analyzed by the microcontroller via a third connector. If an overcurrent which exceeds a threshold value is identified, the load is switched off by means of the semiconductor switch unit which is preferably formed as a MOSFET.

In addition, a MOS-GATE thyristor is present between the input terminals, the control input of which has a connection to a fourth connector of the microcontroller.

When an overvoltage signal is applied, the MOS-GATE thyristor is set into the switch-ON state via the fourth connector.

The overcurrent function of the explained circuit-breaker is realized such that, when a short-circuit occurs at the load or the current value is greater than a predefined threshold value, the microcontroller will identify this by the voltage drop at the shunt, and will switch off the load. Switching the load on again, however, may then also be performed automatically via an external reset.

If an overvoltage event occurs, the voltage across the load will rise until the breakdown voltage of the diode TVS is reached. The resultant voltage drop at the resistor serves as an overvoltage identification signal for the microcontroller, which will then drive the MOS-GATE thyristor so that the overvoltage will be limited.

In parallel to the MOS-GATE thyristor, but also instead of such a thyristor, a semiconductor switch, e.g. formed as an IGBT (Isolated Gate Bipolar Transistor) may be employed. Apart from such an IGBT, also the first semiconductor switch unit, that is formed as a MOSFET, limits the voltage across the load according to the relationship $$U_{load}=U_n+U_G+C_{DS}*du/dt.$$

According to a further development of the invention, a first driver is provided between the second connector of the microcontroller and the first semiconductor switch unit.

Between the second connector of the microcontroller and the control input of the MOS-GATE thyristor or IGBT, a second driver is provided, which will be realized preferably to be galvanically isolated.

If the voltage at the load rises above the gate voltage of the first driver, there is no positive gate-source voltage at the first semiconductor switch unit, which results automatically in the first semiconductor switch unit being switched off. A further rise of the voltage at the load is thus only possible via a voltage change in the capacity of the first semiconductor switch unit formed as a MOSFET (capacity $C_{DS}$). The microcontroller basically switches off the MOSFET, once overvoltage has been detected via the diode TVS. Only after a complete handling of an identified overvoltage event, the microcontroller will switch on the load automatically, whereby an unnecessary plant downtime will be avoided.

As already mentioned, according to the invention, the electronic circuit-breaker may also serve the purpose of protecting from power crossing or other permanent or temporary voltage excesses. In this case, it is identified via the TVS diode whether overvoltage is present. This overvoltage, however, does not fade away within a time of 100 µs to 2 ms as in the case of transient events. Therefore, when the IGBT is switched off after that time, a control signal is applied again on the microcontroller via the TVS diode. If the IGBT is not able to handle the overvoltage even after several switch-off attempts, for example, after a time of 5 to 10 ms, temporary overvoltage is suggested. If such a temporary overvoltage is identified, the microcontroller switches the IGBT to a permanent ON-state and thus triggers an upstream passive safety element $F_1$.

Automatically switching on the circuit-breaker again is performed after an end of the overvoltage event has been analyzed and determined. This is realized in that, for example, the IGBT or MOS-GATE thyristor is switched off cyclically for a short time, and the reaction of the voltage progress is tracked via the series circuit with the TVS diode.

In a further development of the invention, a blocking diode diverting negative overvoltage events may further be provided between the input terminals preferably to be antiparallel to the MOS-GATE thyristor. Positive overvoltage events are detected by the series circuit of the TVS diode and resistor.

For driving large capacitive loads, the switch-on time of the first semiconductor switch unit is controllable by an RC circuit.

In this context, the relevant resistor of the RC circuit situated between the gate of the first semiconductor switch unit and the second connector of the microcontroller is adjustable.

An operational amplifier is connected to the shunt of the current monitoring unit, which operational amplifier has a connection to the third connector of the microcontroller.

In a further development of the invention, an inductance may be connected in series to the load for limiting the short-circuit current.

The reaction time for triggering the first semiconductor switch unit is predefinable by an R-C combination provided at the operational amplifier.

The invention will be explained in more detail below on the basis of an exemplary embodiment and with reference to Figures.

Shown are in:

FIG. 1 a block diagram for the principle explanation of the invention; and

Figure 2:
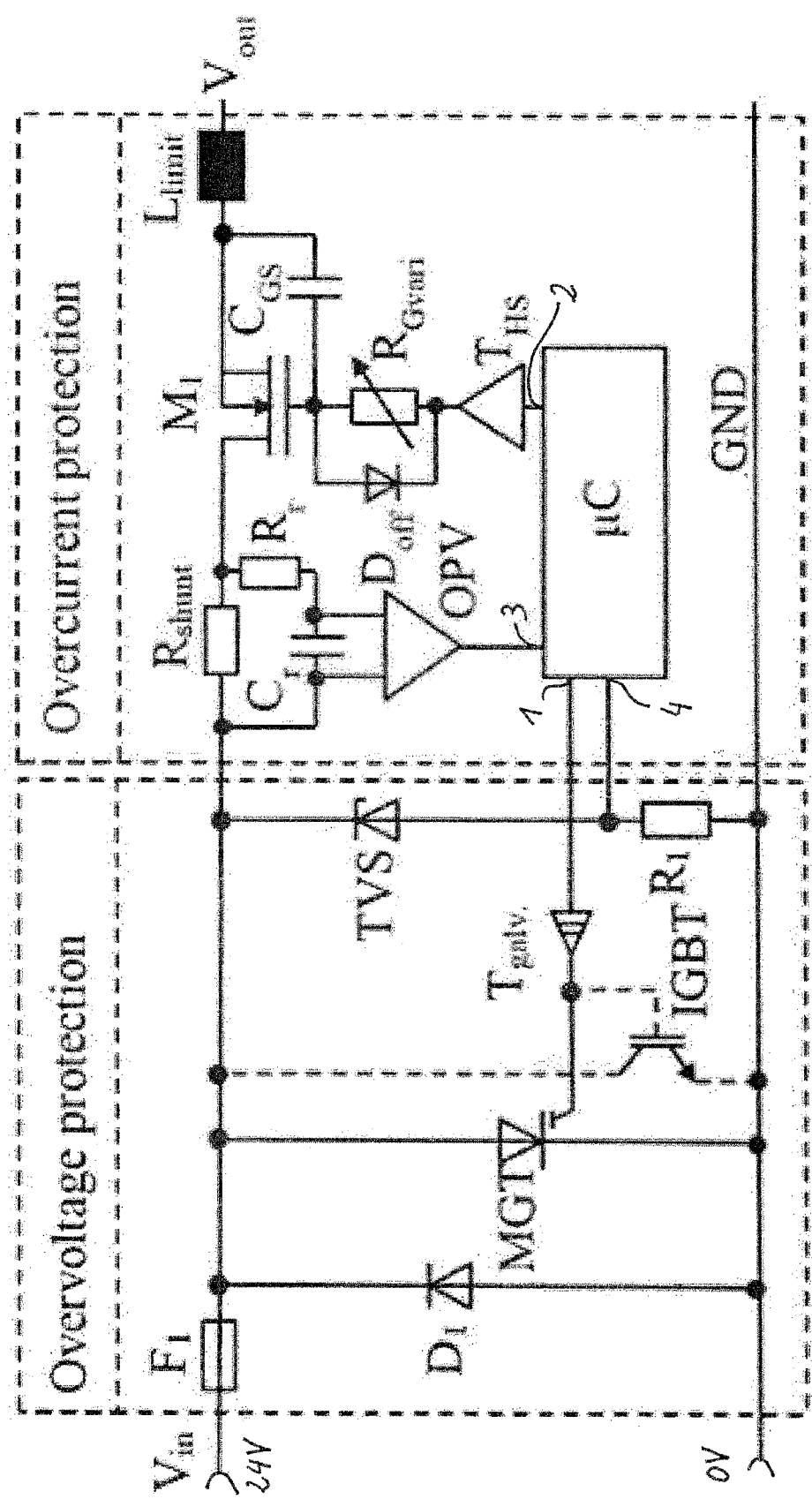

FIG. 2 a further development according to the invention with illustration of the units for the overvoltage protection, on the one hand, and for protection from overcurrents, on the other (in each case frames represented by dashed lines).

Between the input terminals of 0 V/24 V of a relevant DC-voltage network, the series circuit of a TVS diode TVS and a resistor R1 is present downstream of a classical fuse F (FIG. 1) or $F_1$ (FIG. 2).

The resistor R1 has a connection to a first connector 1 of a microcontroller µC.

In case of an event caused by overvoltage and exceeding the breakdown voltage at the TVS diode TVS, a resultant voltage drop ensues at the resistor R1. This voltage drop is detected by the microcontroller µC via the input 1 and processed as an overvoltage identification signal.

A second connector 2 of the microcontroller µC has a connection to a first semiconductor switch unit MOSFET; M1, wherein the first semiconductor switch unit MOSFET; M1 being in series to the load $R_L$ as an elongate switch.

The microcontroller µC blocks the first semiconductor switch unit MOSFET; M1, when, as explained above, the overvoltage identification signal is applied.

A shunt $R_{shunt}$ as a current monitoring unit is formed in series to the load $R_L$, wherein the voltage drop at the shunt is analyzed by the microcontroller µC via a third connector 3, and in case of an identified overcurrent which exceeds a threshold value, the load $R_L$ is switched off by means of the first semiconductor switch unit MOSFET; M1.

Furthermore, a MOS-GATE thyristor MGT or an IGBT (as in FIG. 2) is connected between the input terminals of 0 V/24 V, the control input of which has a connection to a fourth connector 4 of the microcontroller µC such that, when the overvoltage identification signal is applied, the MOS-GATE thyristor MGT or the IGBT (illustrated in dashed lines in FIG. 2) can be set into the switch-ON state.

Between the second connector 2 of the microcontroller µC and the first semiconductor switch unit MOSFET; M1, a first driver T1 (FIG. 1) or THS (FIG. 2) is provided.

Between the fourth connector 4 of the microcontroller µC and the control input of the MGT or the IGBT, a second driver T2 is provided which, according to FIG. 2, preferably is realized as a galvanically isolated driver $T_{galv}$.

According to the embodiment as per FIG. 2, a blocking diode D1 is further present to be antiparallel to the MOS-GATE thyristor MGT or the IGBT for diverting negative overvoltage events. Positive overvoltage events are detected by the series circuit of the TVS diode TVS and the resistor R1.

In the embodiment of the use of an IGBT as a second semiconductor switch unit, the control input of the IGBT is connected to the second driver T2 or $T_{galv}$. As symbolically illustrated in FIG. 1, the driver T2 may further have a connection to a current source.

For driving large capacitive loads, the switch-on time of the first semiconductor switch unit M1 (see FIG. 2) is controllable by an RC circuit $R_{Gvari}$; $C_{GS}$.

The resistor $R_{Gvari}$ of the RC circuit, which resistor is present between the gate of the first semiconductor switch unit M1 and the second connector 2 of the microcontroller, is configurable as an adjustable resistor.

Two inputs of an operational amplifier OPV may either be connected directly to the shunt (see FIG. 1), or else may be connected by means of a further R-C combination.

Regarding this, a capacitor $C_r$ is formed (as shown in FIG. 2) at the operational amplifier OPV between the input terminals of the operational amplifier, and a resistor $R_r$ is formed between an input of the operational amplifier and the shunt. Via a suitable selection of the relevant R-C combination, the reaction time $t_{reaction}$ for triggering the first semiconductor switch unit M1 may be predefined.

With the explained electronic circuit-breaker that is realized according to the exemplary embodiment, an input voltage range of 8 to 48 V may be covered at a nominal voltage of 24 V. A value of 10 A is set, for example, as the nominal current, wherein the maximum current is adjustable. The capacitive load may reach up into a range of 15 mF.

Apart from the analysis of the voltage dropping at the shunt, an overcurrent event may also be detected by the voltage drop between the drain and source of the MOSFET. The gate voltage for the MOSFET M1 is generated by a charge pump and a so-called highside driver $T_{HS}$, wherein a voltage of 12 to 15 V above the input voltage is achievable during switching on.

The invention claimed is:

1. An electronic circuit-breaker for a load ($R_L$) that can be connected to a low voltage DC-voltage network, the circuit-breaker consisting of assemblies provided between input terminals (0 V/24 V) and the load ($R_L$), and the assemblies comprising a voltage monitoring unit, a current monitoring unit and semiconductor switch units and controllers associated therewith, characterized in that a series circuit consisting of a TVS diode (TVS) and a resistor (R1) is connected to the input terminals (0 V/24 V), wherein the resistor (R1) has a connection to a first connector (1) of a microcontroller (μC), and the resultant voltage drop at the resistor (R1) providing the microcontroller (μC) with an overvoltage identification signal if a breakdown voltage is reached at the TVS diode (TVS) as a result of an overvoltage, a second connector (2) of the microcontroller (μC) has a connection to a first semiconductor switch unit (MOSFET; M1), wherein the first semiconductor switch unit (MOSFET; M1) is in series, as an elongate switch, with the load ($R_L$), wherein the microcontroller (μC) disables the first semiconductor switch unit (MOSFET; M1) when the overvoltage identification signal is applied, a shunt ($R_{shunt}$) as a current monitoring unit is formed in series to the load ($R_L$), wherein the voltage drop at the shunt ($R_{shunt}$) is analyzed by the microcontroller (μC) via a third connector (3), and in case of an identified overcurrent which exceeds a threshold value, the load ($R_L$) is switched off by means of the first semiconductor switch unit (MOSFET; M1), furthermore, a MOS-GATE thyristor (MGT; IGBT) is connected between the input terminals (0 V/24 V), the control input of which has a connection to a fourth connector (4) of the microcontroller (μC) such that when the overvoltage identification signal is applied, the MOS-GATE thyristor (MGT; IGBT) is settable into the switch-ON state.

2. The electronic circuit-breaker according to claim 1, characterized in that a first driver (T1; $T_{HS}$) is provided between the second connector (2) of the microcontroller (μC) and the first semiconductor switch unit (M1; MOSFET).

3. The electronic circuit-breaker according to claim 1, characterized in that a second driver (T2), preferably a galvanically isolated driver, is provided between the fourth connector (4) of the microcontroller (μC) and the control input of the MOS-GATE thyristor (MGT).

4. The electronic circuit-breaker according to claim 1, characterized in that a blocking diode (D1) for diverting negative overvoltage events is provided to be antiparallel to the MOS-GATE thyristor (MGT; IGBT), wherein positive overvoltage events are detected by the series circuit of the TVS diode (TVS) and resistor (R1).

5. The electronic circuit-breaker according to claim 1, characterized in that a second semiconductor switch unit formed as an IGBT is connected in parallel to the MOS-GATE thyristor (MGT), wherein the control input of the IGBT has a connection to the fourth connector (4) of the microcontroller (μC), or the IGBT replaces the MOS-GATE thyristor (MGT).

6. The electronic circuit-breaker according to claim 5, characterized in that the control input of the IGBT is connected to the second driver (T2; $T_{galv}$).

7. The electronic circuit-breaker according to claim 1, characterized in that for driving large capacitive loads, the switch-on time of the first semiconductor switch unit (M1) is controllable by an RC circuit ($R_{Gvari}$; $C_{GS}$).

8. The electronic circuit-breaker according to claim 7, characterized in that the resistor ($R_{Gvari}$) of the RC circuit, which resistor ($R_{Gvari}$) is situated between the gate of the first semiconductor switch unit (M) and the second connector (2) of the microcontroller (μC), is adjustable.

9. The electronic circuit-breaker according to claim 1, characterized in that to the shunt, an operational amplifier (OPV) is connected, which has a connection to the third connector (3) of the microcontroller.

10. The electronic circuit-breaker according to claim 9, characterized in that the reaction time for triggering the semiconductor switch unit (M1) is predefinable by an R-C combination ($R_c$; $C_r$) provided at the operational amplifier (OPV).

11. The electronic circuit-breaker according to claim 1, characterized in that an inductance ($L_{limit}$) is connected in series to the load ($R_L$) for limiting the short-circuit current.

\* \* \* \* \*